US012002702B2

(12) United States Patent
Balasubramanian et al.

(10) Patent No.: US 12,002,702 B2
(45) Date of Patent: Jun. 4, 2024

(54) WAFER DE-CHUCKING DETECTION AND ARCING PREVENTION

(71) Applicant: APPLIED MATERIALS, INC., Santa Clara, CA (US)

(72) Inventors: Ganesh Balasubramanian, Fremont, CA (US); Byung Chul Yoon, Seongnam-si (KR); Hemant Mungekar, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/929,144

(22) Filed: Sep. 1, 2022

(65) Prior Publication Data
US 2022/0415695 A1 Dec. 29, 2022

Related U.S. Application Data

(62) Division of application No. 16/217,768, filed on Dec. 12, 2018, now Pat. No. 11,437,262.

(51) Int. Cl.
*H01L 21/683* (2006.01)
*H01J 37/32* (2006.01)
(Continued)

(52) U.S. Cl.
CPC .... *H01L 21/6833* (2013.01); *H01J 37/32697* (2013.01); *H01J 37/32715* (2013.01);
(Continued)

(58) Field of Classification Search
CPC ........... H01L 21/6833; H01L 21/67253; H01L 21/67288; H01L 22/20; H01J 37/32697;
(Continued)

(56) References Cited

U.S. PATENT DOCUMENTS

| 5,610,715 A | | 3/1997 | Yoshii et al. |
| 5,894,400 A | * | 4/1999 | Graven .................. H02N 13/00 279/128 |

(Continued)

FOREIGN PATENT DOCUMENTS

| CN | 107154334 A | 9/2017 |
| WO | 2011031589 A2 | 3/2021 |

OTHER PUBLICATIONS

PCT Notification of Transmittal of the International Search Report and the Written Opinion of the International Searching Authority for PCT Application No. PCT/US2019/065745, dated Apr. 13, 2020, 13 pages.

(Continued)

*Primary Examiner* — Jarrett J Stark
(74) *Attorney, Agent, or Firm* — Lowenstein Sandler LLP

(57) ABSTRACT

Methods and systems of detection of wafer de-chucking in a semiconductor processing chamber are disclosed. Methods and systems of interdiction are also disclosed to prevent hardware and wafer damage during semiconductor fabrication if and when de-chucking is detected. In one embodiment, a de-chucking detection method is based on measuring change in imaginary impedance of a plasma circuit, along with measuring one or both of reflected RF power and arc count. In another embodiment, a possibility of imminent de-chucking is detected even before complete de-chucking occurs by analyzing the signature change in imaginary impedance.

20 Claims, 6 Drawing Sheets

(51) Int. Cl.
*H01L 21/66* (2006.01)
*H01L 21/67* (2006.01)

(52) U.S. Cl.
CPC .. *H01L 21/67253* (2013.01); *H01L 21/67288* (2013.01); *H01L 22/20* (2013.01); *H01J 2237/24564* (2013.01); *H01J 2237/24578* (2013.01)

(58) Field of Classification Search
CPC ....... H01J 37/32715; H01J 2237/24564; H01J 2237/24578
See application file for complete search history.

(56) References Cited

U.S. PATENT DOCUMENTS

| | | | |
|---|---|---|---|
| 6,377,060 B1 | 4/2002 | Burkhart | |
| 7,063,988 B1* | 6/2006 | Rha | H01L 21/67253 |
| | | | 438/5 |
| 8,251,011 B2* | 8/2012 | Yamazawa | H01J 37/32174 |
| | | | 156/345.43 |
| 11,437,262 B2 | 9/2022 | Balasubramanian et al. | |
| 11,664,233 B2* | 5/2023 | Ishiguro | H01L 21/6833 |
| | | | 216/61 |
| 2004/0031699 A1* | 2/2004 | Shoji | H01L 21/6833 |
| | | | 205/791.5 |
| 2005/0052817 A1* | 3/2005 | Kellerman | H02N 13/00 |
| | | | 361/234 |
| 2007/0215282 A1* | 9/2007 | Itabashi | H01J 37/32706 |
| | | | 156/345.35 |
| 2008/0133154 A1* | 6/2008 | Krauss | H01J 37/32935 |
| | | | 702/58 |
| 2009/0308734 A1* | 12/2009 | Krauss | H01J 37/32935 |
| | | | 204/298.03 |
| 2010/0008015 A1 | 1/2010 | Booth et al. | |
| 2010/0090711 A1* | 4/2010 | Shih | H01L 21/6833 |
| | | | 324/649 |
| 2011/0058302 A1* | 3/2011 | Valcore, Jr. | H01L 21/67069 |
| | | | 361/234 |
| 2011/0090613 A1* | 4/2011 | Balasubramanian | H01L 21/6831 |
| | | | 702/65 |
| 2012/0283865 A1 | 11/2012 | Bailey | |
| 2017/0032935 A1* | 2/2017 | Benjamin | H01L 21/67253 |
| 2017/0040198 A1* | 2/2017 | Lin | H01L 21/68735 |
| 2018/0025930 A1* | 1/2018 | Augustyniak | H01L 21/67207 |
| | | | 438/798 |
| 2019/0259674 A1* | 8/2019 | Howald | H01L 22/26 |
| 2019/0341285 A1* | 11/2019 | Gadre | H01J 37/32926 |
| 2020/0194299 A1* | 6/2020 | Balasubramanian | H01L 22/20 |
| 2020/0357675 A1* | 11/2020 | Noorbakhsh | H01L 21/67069 |
| 2020/0388518 A1* | 12/2020 | Mungekar | H01L 21/68 |
| 2021/0391141 A1* | 12/2021 | Baker | H01J 37/32935 |
| 2022/0102179 A1* | 3/2022 | Ye | H01J 37/32697 |

OTHER PUBLICATIONS

Search Report for Taiwan Application No. TW108145494, dated Sep. 20, 2023, 1 Page.

* cited by examiner

WAFER DE-CHUCKING DETECTION AND ARCING PREVENTION

RELATED APPLICATIONS

This application claims the benefit of U.S. patent application Ser. No. 16/217,768 filed Dec. 12, 2018, the entire contents of which are incorporated by reference herein.

TECHNICAL FIELD

The present disclosure generally relates to detection of lack of proper contact between a wafer and a substrate-holder and methods of interdiction to prevent hardware and wafer damage caused by improper wafer contact with the substrate-holder during semiconductor fabrication.

BACKGROUND

In semiconductor processing chambers that use high power plasma processes, there is a risk of damage of certain chamber hardware if the hardware comes in contact with the plasma in an unintended way. A substrate-holder (also referred to as "wafer chuck" or simply "chuck") that holds a wafer may have heaters to raise the temperature of the wafer as required by a particular process recipe. Ideally, the heater on a faceplate of the chuck should be fully covered by a wafer placed on a chuck when the center of the wafer is properly aligned with the chuck, and/or when there is proper contact established between the chuck and the wafer in the z-direction. However, a robot may fail to place the wafer perfectly on the chuck. Additionally or alternatively, the wafer may have some 'bow' that prevents proper contact with the chuck and the heater. For example, three-dimensional NAND memory wafers have many deposition layers and develop a bow due to thermal or mechanical stress between the layers. The bow may also be part of the silicon substrate before the layers are deposited. The bow not only exposes the heater to the high power plasma, causing damage of the heater/faceplate, but also increases the risks of the wafer losing contact with the chuck, resulting in undesirable coating on the backside of the wafer to the extent the wafer needs to be discarded altogether.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Methods and systems of detection of wafer de-chucking in a semiconductor processing chamber using virtual sensor are disclosed. Methods and systems of interdiction are also disclosed to prevent hardware and wafer damage during semiconductor fabrication if and when de-chucking is detected. In one embodiment, a de-chucking detection method is based on measuring change in imaginary impedance of a plasma circuit in the system, along with measuring one or both of reflected RF power and arc count. In another embodiment, a possibility of imminent de-chucking is detected even before complete de-chucking occurs by analyzing the signature change in imaginary impedance.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to systems and methods of detection of loss of wafer contact in a semiconductor processing chamber. Complete loss of wafer contact is known as "de-chucking." When the wafer is de-chucked, high power plasma causes arcs in the gap between the wafer and the substrate-holder, damaging unprotected hardware components of the substrate-holder as well as the wafer itself. The systems and methods taught herein enable interdiction to prevent hardware and wafer damage during semiconductor fabrication if de-chucking, or a possibility of immediate de-chucking, is detected.

High power plasma processes are common in semiconductor processing. An example high power plasma process may be plasma enhanced chemical vapor deposition (PECVD), though other processes, such as plasma etching, plasma cleaning etc. are within the scope of the disclosure. Even if an incoming wafer does not have a significant bow, and there is no wafer placement error at the beginning, the bow may worsen during the high-power plasma process. As the wafer bow increases, electrostatic clamping force used by the substrate-holder may eventually become insufficient to hold the wafer down, resulting in complete loss of contact, i.e. de-chucking. If complete de-chucking happens, then the risk of hardware damage and wafer scrapping increases significantly.

An existing de-chucking detection method is based on counting the number of arcs during wafer processing when the high-power plasma is on. However, it is hard to gather reliable data based on arc count only, because arcing may happen for reasons other than de-chucking, and it is difficult to separate the causes of arcing and correlate the data more directly with de-chucking only.

This disclosure describes methods and systems which detect de-chucking fairly early using unique insight into the physics of high power plasma, so that the current process can be stopped relatively quickly after de-chucking has happened, and the erroneous situation can be corrected before further processing. Imaginary impedance and reflected RF power are two of the metrics (in addition to the traditional arc count metric) that are associated with the fundamental physics of a high-power plasma process, and can be measured by sensors. At least two of these three metrics is utilized to detect de-chucking immediately after it happens. Some embodiments of the present disclosure enable appropriate intervention even before complete loss of contact happens. Additionally, the systems and methods described herein prevent undesirable arcs in a high power plasma environment.

Figure 1A:
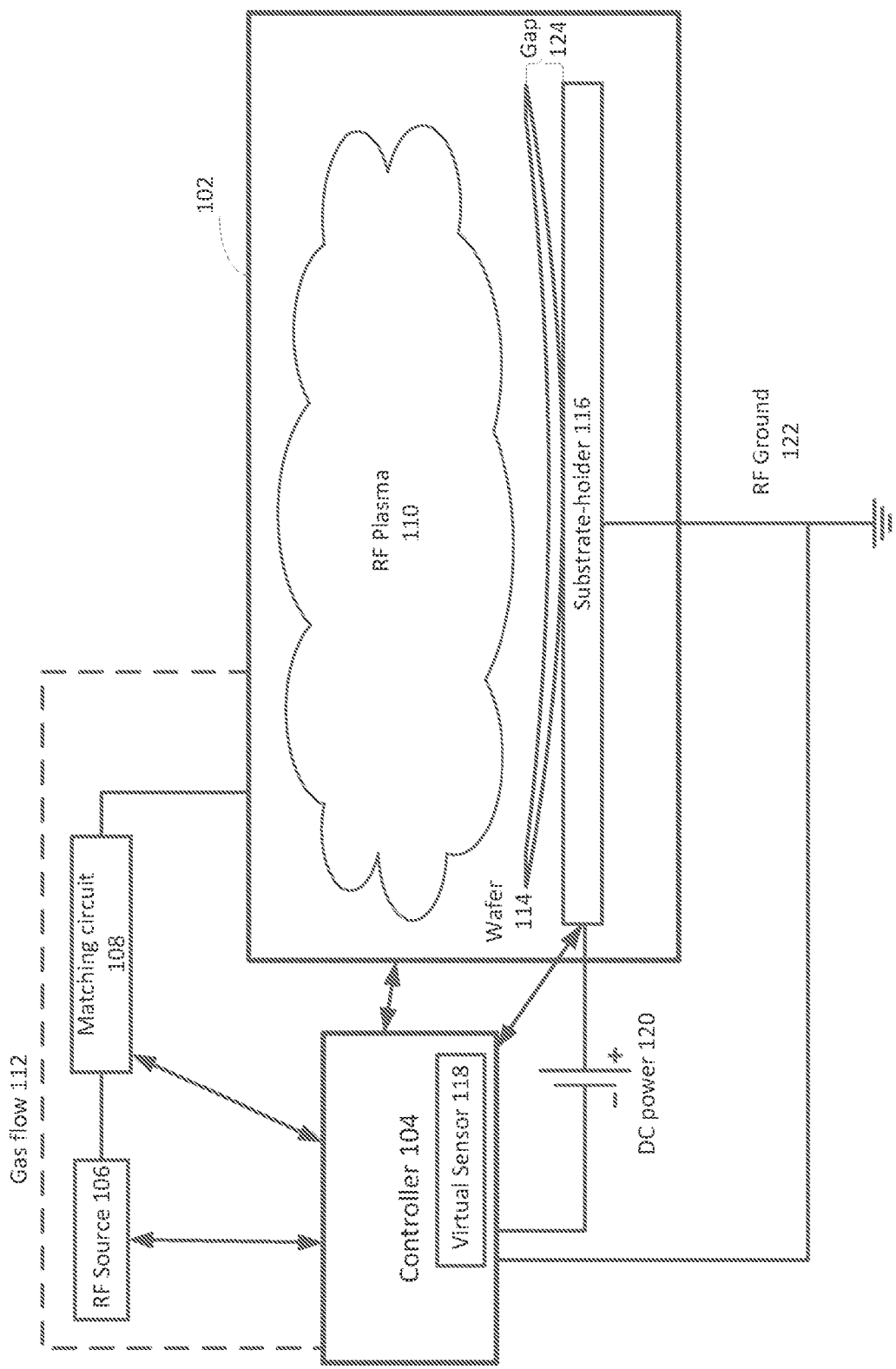
FIG. 1A is a schematic of a plasma processing system, in accordance with some embodiments of the present disclosure.

FIG. 1A is a schematic of a plasma processing system with a variety of sensors, in accordance with some embodiments of the present disclosure. The term "virtual sensor" is used to describe a processor 118 that processes data derived from direct measurements performed by real sensors. Data is derived from imaginary impedance measurement, reflected RF power measurement and arc count measurement. The wafer chucking error is calculated by the processor from these measurements.

Referring back to FIG. 1A, a processing chamber 102 is controlled by a tool controller 104 during initial set-up of the chamber 102 for a plasma process and during the subsequent high power plasma process itself. There is a high power RF source 106 (e.g., power level can be in the range of or in excess of 2000 W) comprising a RF generator controlled by an RF source controller (not shown separately for simplicity). In one embodiment, the RF source controller can be a component within the RF source 106, and is communicatively coupled to the tool controller 104. A matching circuit 108 may also be communicatively coupled to the tool controller 104. RF source 106 powers a plasma circuit. The plasma circuit includes a high power RF plasma 110 created adjacent to a wafer 114 within the chamber 102. The plasma circuit includes various components in between the RF source 106 and the RF ground 122, including the matching circuit 108, the RF plasma 110 and other components integral to the processing chamber 102. The tool controller 104 also controls precursor gas flow 112 into the chamber 102 to create the plasma 110.

The wafer 114 is held by a substrate-holder 116. The substrate-holder can comprise an electrostatic chuck (ESC), though the scope of the disclosure is not limited to ESC only. ESC can be a platen with electrodes biased with a DC voltage to establish electrostatic holding force to keep a wafer in place with respect to a substrate-holder. Ideally, there should not be any gap between the wafer 114 and the substrate-holder 116. However, due to improper chucking and/or excessive wafer bow, there may be an undesirable finite gap 124 between the wafer 114 and the substrate-holder 116. Because of this gap, arcing may happen between the wafer and the substrate-holder when high power RF plasma 110 is on, and the arcing may damage exposed portions of the substrate-holder (including the heater and the faceplate) as well as the wafer itself. Also, undesired coating may adhere to the backside of the wafer as plasma reaches the gap 124. An additional sensor may be included to measure a bow of the wafer, based on which a power of the DC source that powers the ESC can be varied to adjust the electrostatic chucking force. In one embodiment, prior to placing a wafer on the ESC, the incoming bow is measured, and power of the DC source is adjusted accordingly. Additionally, or alternatively, the bow of the wafer is monitored as a current plasma process progresses in time, and power of the DC source is adjusted according to the monitored bow of the wafer to adjust the electrostatic chucking force required to maintain contact with the ESC.

Figure 1B:
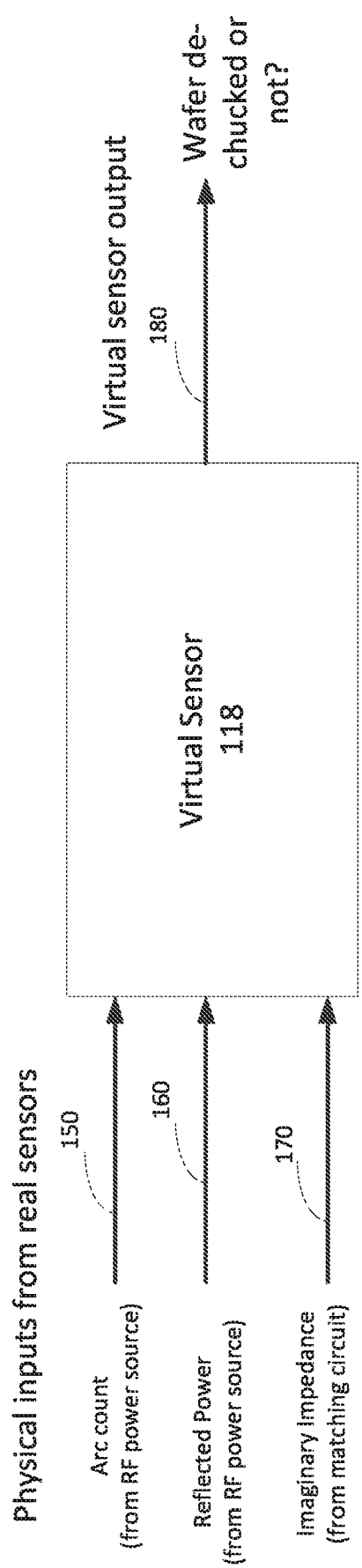
FIG. 1B is a block diagram of virtual sensor inputs and outputs, in accordance with some embodiments of the present disclosure.

The substrate-holder 116 may have a path to RF ground 122. In case of an electrostatic chuck (ESC), a DC power source 120 is coupled to the substrate-holder 116 to create an electrostatic force that holds down the wafer. The DC power source may be a monopolar source or a bipolar source. Various input parameters, such as arc count 150 (derived from measurement by real sensors within the RF source 106), reflected RF power 160 (derived from measurements by real sensors in the RF source 106) and imaginary impedance 170 (derived from measurements by real sensors in the matching circuit 108) are sent to a virtual sensor 118 in the tool controller 104, as shown in FIG. 1B. Specifically, the imaginary impedance 170 is associated with the plasma circuit, as described before. The reflected RF power 160 is the power difference between a set point of the RF generator and the amount of power the RF generator actually delivered (known as the forward power). When the RF source 106 senses that some of the power delivered is being reflected by the plasma circuit due to load mismatch, the controller within the RF source 106 compensates by forcing the RF generator to deliver more forward power to counter the reflected power. The arc count is the number of arcs in the chamber when the plasma is on. When there is good contact between the ESC and the wafer, number of arcs is stable. The processor in the virtual sensor 118 runs algorithms using the various physical inputs received from the real sensors to detect whether the wafer is de-chucked or not. Based on the output 180 of the virtual sensor 118, appropriate preventive action may be taken by the system.

Figure 2:
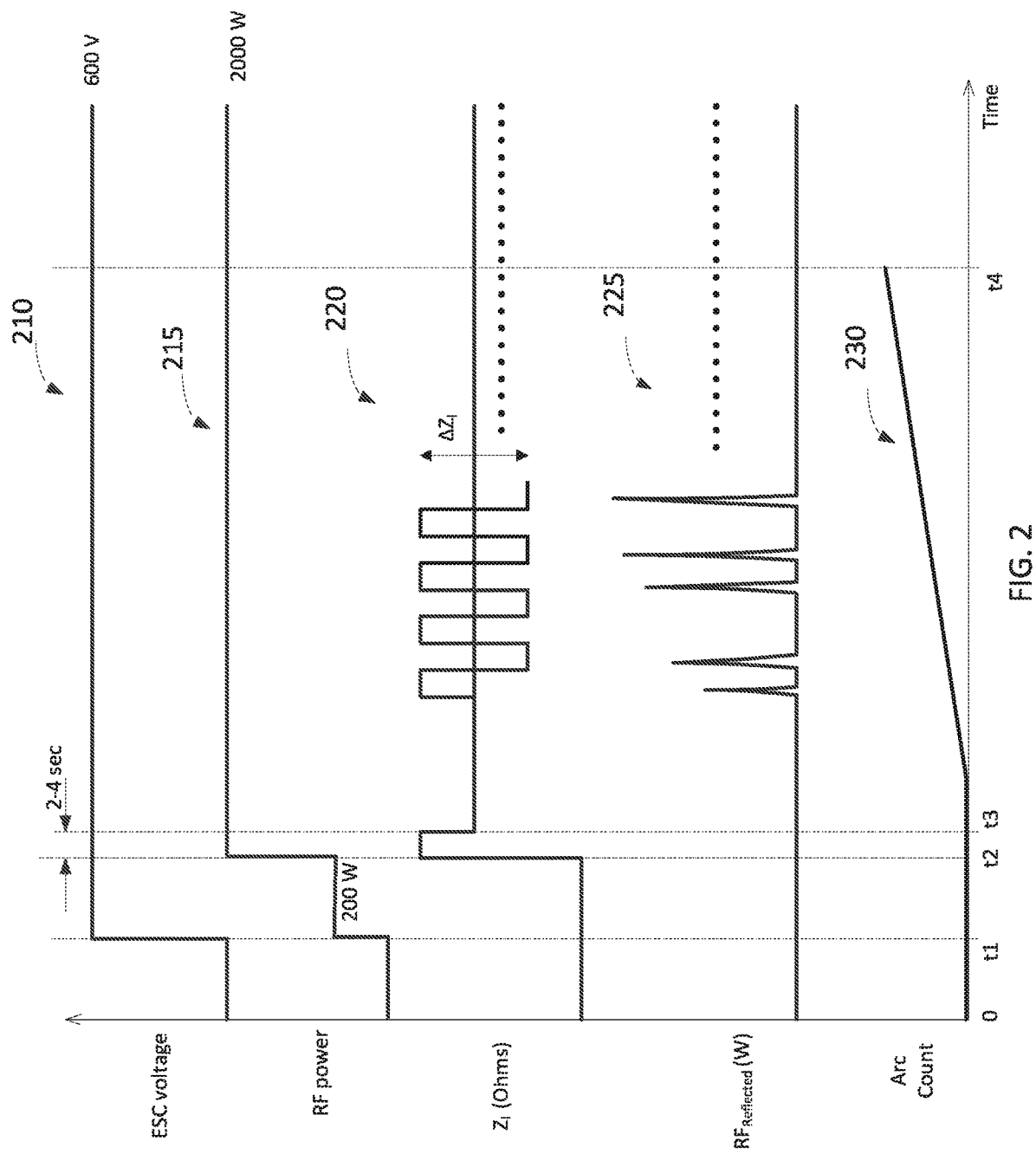
FIG. 2 shows plots of various process parameters derived from measurements by sensors in a plasma chamber to detect de-chucking, according to an embodiment of this disclosure.

FIG. 2 shows a number of different plots as a high-power plasma process progresses in time. The time period from $t=0$ to $t=t_2$ is the set-up time window, and the time period from $t=t_3$ to $t=t_4$ is a monitoring time window. Depending on whether a heater is used in the substrate-holder and whether the substrate-holder is a electrostatic chuck (ESC), there are two set-up stages, as shown in FIG. 2: a heat-up stage (from $t=0$ to $t=t_1$), and an ESC set-up stage (from $t=t_1$ to $t=t_2$). The monitoring time window may extend arbitrarily beyond t4 as long as the plasma is on, but usually if a possibility of de-chucking is detected within the monitoring time window, further processing is stopped, and the wafer is removed. Also, it is to be noted that the monitoring time window usually starts after a slight delay ($t_3-t_2$) (typically 2-4 sec, but other values are possible too) after the set-up is complete. Note that, numerical values shown in FIG. 2 are for illustrative purposes only and do not limit the scope of the disclosure.

The top plot 210 is a plot of the ESC voltage. Initially in the heat-up stage, the ESC voltage is zero. At $t=t_1$, the DC power supply is turned on. A typical ESC voltage is 600V, which is maintained steady throughout the plasma process $t_1$ onwards.

The plot 215 is a plot of the RF power that is used to create plasma. At the heat-up stage, the RF power is off. At the ESC set-up stage, the RF power is on, but the power level is kept low (at around 150-200 W) to prevent creating a high power plasma. No precursor gas is flown into the processing chamber during any of these two set-up stages. Once the ESC set-up stage is completed at $t=t_2$, and it is determined that it is safe to continue the high power plasma process, high RF power (typically in the range of or in excess of 2000 W) is turned on and the precursor gases are flown into the chamber to create a plasma adjacent to the wafer, as shown in FIG. 1.

The plot 220 is a plot of imaginary impedance when the high power RF plasma is on. The imaginary impedance is a measure of load and source mismatch in a plasma environment. More particularly, capacitance (imaginary component of impedance of the plasma circuit) varies in a plasma environment depending on whether the wafer is properly chucked on the substrate-holder. A change in imaginary impedance ($\Delta Z_1$) indicates that the contact between the wafer and the substrate-holder has changed. If $\Delta Z_1$ crosses a predefined threshold, that may indicate that de-chucking may have happened.

The plot 225 is a plot of reflected RF power when the high power RF plasma is on. If reflected RF power keeps increasing beyond a predefined threshold value, then that may indicate distinct possibility of de-chucking.

The plot 230 is a plot of arc count when the high power RF plasma is on. If the number of arc counts, as measured by a sensor, increases beyond expected count at a particular point in time, then that may indicate distinct possibility of de-chucking.

Figure 3:
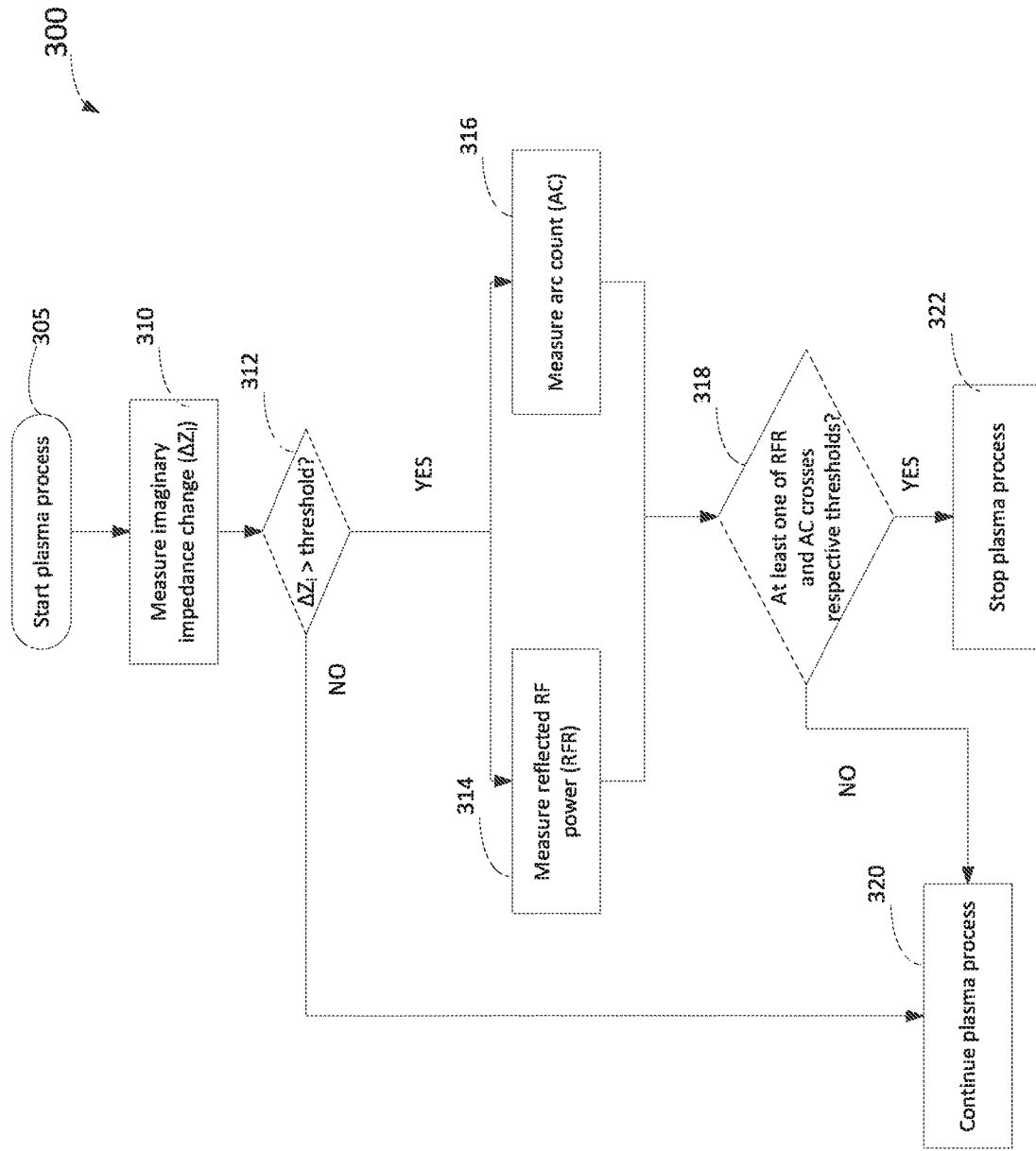
FIG. 3 shows a flow diagram of an example method for damage prevention based on measurement data available from multiple types of sensors, according to an embodiment of this disclosure.

FIG. 3 is a flow diagram of an example method 300 to enable early de-chucking detection and arc prevention, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. For example, controller 104 in FIG. 1 may execute the method 300. Although shown in a particular sequence or order, unless otherwise specified, the order of the processes in method 300 or other methods described below with illustrative flowcharts can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. The method 300 performs a damage prevention action responsive to determining that the wafer is de-chucked.

Method 300 starts at block 305, where the high power plasma is turned on and monitoring begins. At block 310, change in imaginary impedance ($\Delta Z_I$) is measured. At block 312, it is determined whether $\Delta Z_I$ exceeds a predetermined threshold value. If $\Delta Z_I$ does not exceed a threshold value, then the plasma process continues, i.e. the method propagates to block 320. However, if $\Delta Z_I$ does exceed the threshold value, then further steps are taken to determine if it is safe to continue the plasma process. The threshold may be 5-7 Ohm, depending on the chamber and the process recipe. The further steps in method 300 include analyzing data from at least one additional sensor.

One possible additional measurement may be reflected RF power, as shown at block 314. If the reflected RF power crosses a predetermined maximum threshold value, for example 200 W, then that may indicate de-chucking.

Another possible additional measurement may be arc count, as shown at block 316. If the arc count exceeds an expected cumulative maximum value, e.g. exceeds 300 arc within a specified monitor window, then that may also indicate de-chucking.

The method 300 uses one or both of reflected RF power and arc count measurements, i.e. data from either or both of blocks 314 and 316 may be used in conjunction with data from block 310 to reach a final decision at block 318. If at least one of the reflected RF power and arc count crosses their respective predetermined maximum value thresholds, then the current plasma process is stopped at block 322, thereby preventing damage to the wafer and/or components of the processing chamber. Otherwise, the current plasma process is continued at block 320. In other words, the imaginary impedance measurement is not the only data relied on to make a decision about intervention. The detection is more robust against false positives and false negatives as multiple signals are used to reach a final decision. Persons skilled in the art would appreciate that the threshold values for each measurement can be varied, and instead of specific threshold values, threshold ranges can be provided to accommodate varying processes, i.e. threshold values can be chamber-specific and/or process specific.

In one embodiment, an early de-chucking detection method uses the imaginary impedance data to be able to detect a possibility of imminent de-chucking even before it happens. This computational method is based on a signature change in imaginary impedance that is observed immediately before de-chucking happens. The value of imaginary impedance is measured by real sensors in the matching circuit 108. In the time frame immediately before de-chucking, imaginary impedance value for a finite time window is less than (A-B), where A is an ideal value of the imaginary impedance when the wafer has proper contact with the ESC, and B is an offset from A that indicates an imminent loss of contact of the wafer from the ESC. The value of A is chamber-specific and process-recipe specific. The value of A is learned by the computational method. The change in imaginary impedance value over the finite time window (e.g., 1 sec window) may be in the range of 0.2-0.3 Ohm under normal condition. However, if the rate of change in imaginary impedance is suddenly much larger, that indicates a possible fault situation, i.e. de-chucking is about to happen. Experimental data shows that for A=4.2 Ohm and B=1 ohm, a 3-4 seconds advanced warning is available by using the early de-chucking detection method. A system performing the method of this embodiment comprises a processor executing the computations, and a memory that stores values of A and B.

Figure 4:
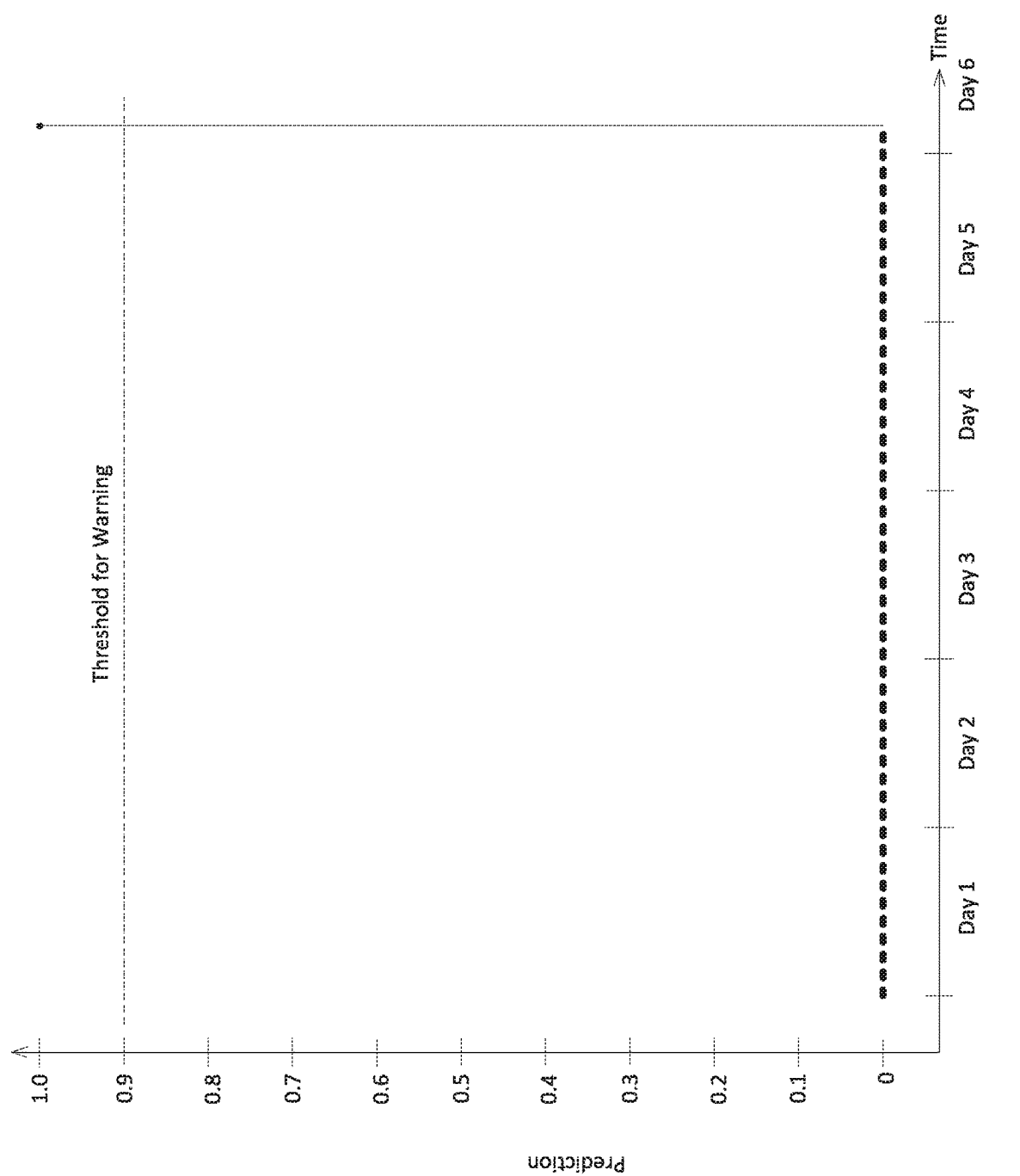
FIG. 4 shows results from an interdiction method, according to an embodiment of this disclosure.

FIG. 4 shows results of a de-chucking detection method shown in FIG. 3. Based on combined data from multiple types of sensors, as described above, the outcome of the de-chucking detection method indicates whether there is no de-chucking, or a possible de-chucking. If an algorithm based on the method 300 predicts de-chucking, then the outcome is 1, and if the algorithm predicts no de-chucking, then the outcome is zero. Each day, multiple wafers were processed. As shown in the example of FIG. 4, for the first five days, no de-chucking was detected, i.e. the algorithm outcome is consistently zero. Each dot on the plot indicates one wafer. No. of wafers processed per day can vary. On Day 6, the algorithm predicts possible de-chucking for one particular wafer, and the outcome is one for that wafer. A warning threshold may be set up close to 1 (e.g., 0.9 shown in FIG. 4), to allow stopping the process if a possibility of de-chucking is predicted by the virtual sensor based on data collected within the monitoring window.

In summary, the method described herein use physics-based insights into the plasma properties to detect lack of proper contact between a wafer and a substrate-holder in a plasma environment. The lack of contact may be in the form of loss of contact in the z-direction. At least one of reflected RF power measurement and arc count measurement is used in conjunction with measurement of imaginary impedance change to prevent processing a wafer in a faulty condition which may lead to hardware and/or wafer damage. A novel use of a combination of data processed by the virtual sensor provides for an effective stoppage method with high-confidence, i.e. interdiction is fast enough to prevent damage to substrate-holder hardware and/or the wafer itself. Proximity to the tool is needed for fast interdiction. Therefore, the methods described herein are executed in the tool mainframe controller, e.g., controller 104 shown in FIG. 1.

Figure 5:
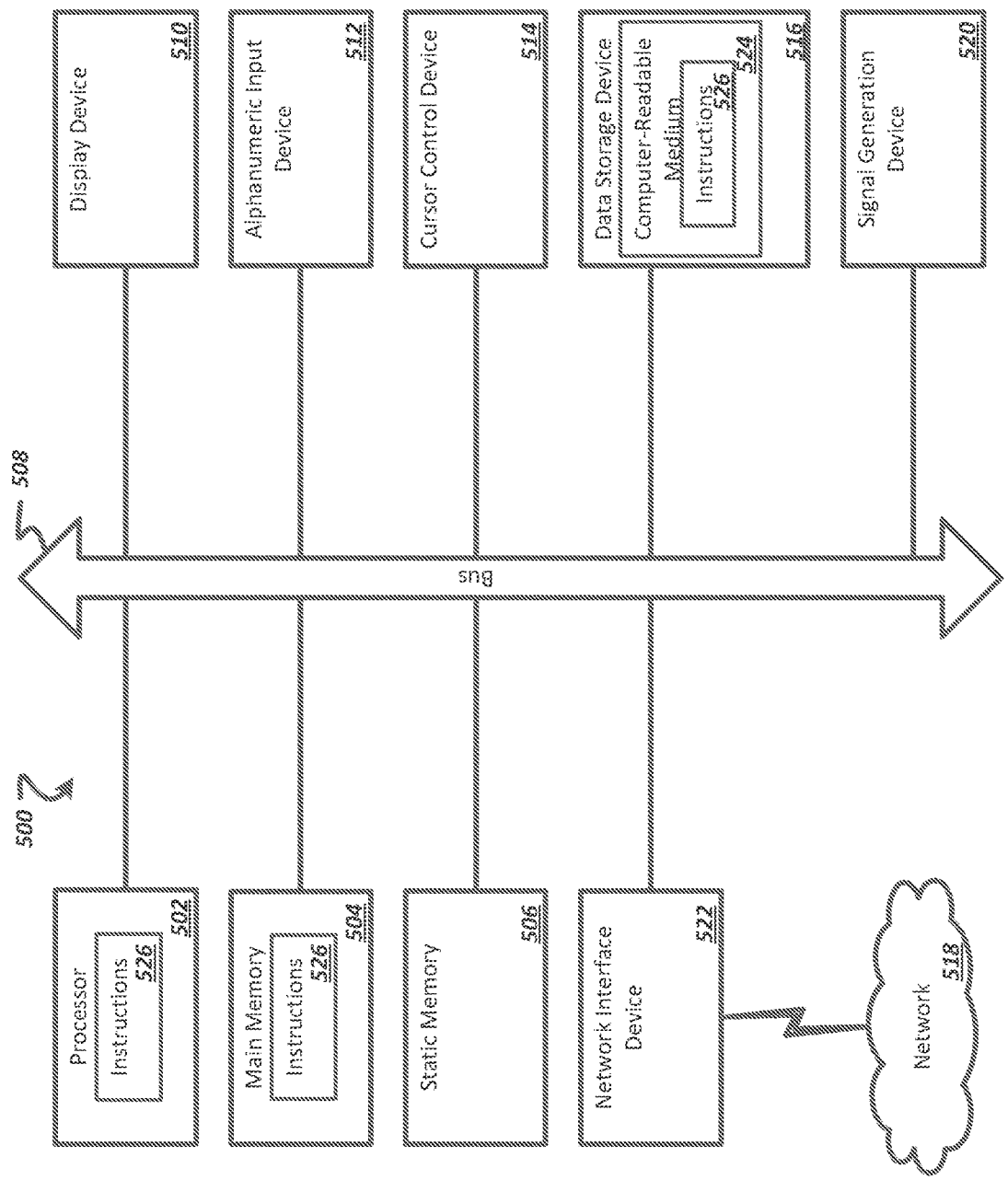
FIG. 5 shows a simplified environment within which the methods and systems of the present disclosure may be implemented.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) etc.), a static memory 506 (e.g., flash memory, static random access memory (SRAM), etc.), and a data storage device 516, which communicate with each other via a bus 508.

Processing device 502 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute instructions for performing the operations and steps discussed herein.

The computer system 500 may further include a network interface device 522 to communicate over the network 518. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse or a touch pad,), a signal generation device 520 (e.g., a speaker), a graphics processing unit (not shown), video processing unit (not shown), and audio processing unit (not shown).

The data storage device 516 may include a machine-readable storage medium 524 (also known as a computer-readable medium) on which is stored one or more sets of instructions or software embodying any one or more of the methodologies or functions described herein. The instructions may also reside, completely or at least partially, within the main memory 504 and/or within the processing device 502 during execution thereof by the computer system 500, the main memory 504 and the processing device 502 also constituting machine-readable storage media.

In one implementation, the instructions include instructions to implement functionality corresponding to a height difference determination. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A method of damage prevention for a semiconductor processing chamber, the method comprising:
   placing a wafer on an electrostatic chuck (ESC);
   creating plasma adjacent to the wafer inside the processing chamber;
   calculating, by a virtual sensor, a change in imaginary impedance ($\Delta Z_I$) of a plasma circuit formed when the plasma is created inside the processing chamber;
   determining, by the virtual sensor, if the wafer is de-chucked from the ESC based on the change in imaginary impedance and further based on data from at least a first physical sensor or a second physical sensor; and
   performing a damage prevention action responsive to determining that the wafer is de-chucked.

2. The method of claim 1, wherein the determining further comprises:
   comparing, by a processor, the calculated $\Delta Z_I$ with a predetermined first threshold value to produce a first result, wherein the first result having a first value above the predetermined first threshold value indicates that the wafer is de-chucked.

3. The method of claim 2, wherein the method further comprises:
   measuring reflected RF power by the first physical sensor;
   measuring an arc count by the second physical sensor;
   comparing the measured reflected RF power with a predetermined second threshold value to produce a second result, wherein the second result having a second value above the predetermined second threshold value indicates that the wafer is de-chucked;
   comparing the measured arc count with a predetermined third threshold value to produce a third result, wherein the third result having a third value above the predetermined third threshold value at least partially indicates that the wafer is de-chucked; and
   determining, based on the first result, and at least one of the second result and the third result, whether it is safe to continue a plasma process without a risk of damaging at least one of the ESC and the wafer.

4. The method of claim 1, wherein performing the damage prevention action comprises:
   stopping a current plasma process.

5. The method of claim 1, further comprising:
   prior to placing the wafer on the ESC, measuring an incoming bow of the wafer; and
   adjusting a power of a DC source that powers the ESC according to the measured incoming bow of the wafer.

6. The method of claim 5, further comprising:
   monitoring a bow of the wafer as a current plasma process progresses in time; and
   adjusting the power of the DC source according to the monitored bow of the wafer to adjust electrostatic chucking force required to maintain contact with the ESC.

7. A method of damage prevention for a semiconductor processing chamber, the method comprising:
   calculating, by a virtual sensor, a change in imaginary impedance ($\Delta Z_I$) of a plasma circuit formed when plasma is created inside a processing chamber by a plasma source inside the processing chamber, wherein an electrostatic chuck (ESC) inside the processing chamber is configured to chuck a wafer;
   determining, by the virtual sensor, if the wafer is de-chucked based on the change in imaginary impedance and further based on data from at least a first physical sensor or a second physical sensor; and
   performing a damage prevention action responsive to determining that the wafer is de-chucked.

8. The method of claim 7, further comprising:
   comparing the calculated $\Delta Z_I$ with a predetermined first threshold value to produce a first result, wherein the first result having a first value above the predetermined first threshold value indicates that the wafer is de-chucked.

9. The method of claim 8, wherein the first physical sensor comprises a reflected RF power sensor that measures a power difference between a set point of an RF generator and an amount of power delivered by the RF generator.

10. The method of claim 9, wherein the second physical sensor comprises an arc count sensor that measures a number of arcs in the semiconductor processing chamber when plasma is on.

11. The method of claim 10, further comprising:
    comparing the measured reflected RF power with a predetermined second threshold value to produce a second result, wherein the second result having a second value above the predetermined second threshold value indicates that the wafer is de-chucked;
    comparing the measured arc count with a predetermined third threshold value to produce a third result, wherein the third result having a third value above the predetermined third threshold value at least partially indicates that the wafer is de-chucked; and
    determining, based on the first result, and at least one of the second result and the third result, whether the wafer is de-chucked.

12. The method of claim 8, wherein the damage prevention action comprises:
    stopping a current plasma process.

13. The method of claim 8, further comprising:
    storing, in a memory, values of A and B, wherein A is an ideal value of the imaginary impedance when the wafer has proper contact with the ESC, and B is an offset from A that indicates an imminent loss of contact of the wafer from the ESC.

14. The method of claim 13, further comprising:
comparing a measured value of imaginary impedance over a time window with a predetermined value of (A-B); and
predicting, based on a result of the comparing, a possibility of imminent wafer de-chucking.

15. The method of claim 14, further comprising:
measuring, by an additional sensor, a bow of the wafer, based on which a power of a DC source that powers the ESC is varied.

16. A method comprising:
calculating, by a virtual sensor, a change in imaginary impedance ($\Delta Z_I$) of a plasma circuit formed while a plasma is created inside a processing chamber, wherein a wafer is chucked by an electrostatic chuck (ESC) inside the processing chamber;
determining, by the virtual sensor, if the wafer is de-chucked based on the change in imaginary impedance and further based on data from at least a first physical sensor or a second physical sensor; and
performing a damage prevention action responsive to determining that the wafer is de-chucked.

17. The method of claim 16, further comprising:
comparing the calculated $\Delta Z_I$ with a predetermined first threshold value to produce a first result, wherein the first result having a first value above the predetermined first threshold value indicates that the wafer is de-chucked.

18. The method of claim 17, further comprising:
comparing a measured reflected RF power with a predetermined second threshold value to produce a second result, wherein the second result having a second value above the predetermined second threshold value indicates that the wafer is de-chucked;
comparing a measured arc count with a predetermined third threshold value to produce a third result, wherein the third result having a third value above the predetermined third threshold value at least partially indicates that the wafer is de-chucked; and
determining, based on the first result, and at least one of the second result and the third result, whether it is safe to continue a current plasma process without a risk of damaging at least one of the ESC and the wafer.

19. The method of claim 17, further comprising:
storing, in a memory, values of A and B, wherein A is an ideal value of the imaginary impedance when the wafer has proper contact with the ESC, and B is an offset from A that indicates an imminent loss of contact of the wafer from the ESC.

20. The method of claim 17, further comprising:
comparing a measured value of imaginary impedance over a time window with a predetermined value of (A-B); and
predicting, based on a result of the comparing, a possibility of imminent wafer de-chucking.

* * * * *